(12) United States Patent
Fujii et al.

(10) Patent No.: US 10,364,372 B2
(45) Date of Patent: Jul. 30, 2019

(54) COMPOSITION AND METHOD OF PRODUCING SILICEOUS FILM

(71) Applicant: TOKYO OHKA KOGYO CO., LTD., Kawasaki-shi (JP)

(72) Inventors: Yasushi Fujii, Kawasaki (JP); Kunihiro Noda, Kawasaki (JP); Hiroki Chisaka, Kawasaki (JP); Kazuya Someya, Kawasaki (JP); Koichi Misumi, Kawasaki (JP); Dai Shiota, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 84 days.

(21) Appl. No.: 15/856,659

(22) Filed: Dec. 28, 2017

(65) Prior Publication Data

US 2018/0201807 A1 Jul. 19, 2018

(30) Foreign Application Priority Data

Jan. 13, 2017 (JP) .................................. 2017-004430

(51) Int. Cl.
*C08G 77/62* (2006.01)
*C09D 183/16* (2006.01)
*H01L 21/02* (2006.01)
*C08L 83/16* (2006.01)

(52) U.S. Cl.
CPC ...... *C09D 183/16* (2013.01); *H01L 21/02222* (2013.01); *H01L 21/02282* (2013.01); *H01L 21/02318* (2013.01); *H01L 21/02326* (2013.01); *H01L 21/02337* (2013.01); *C08G 77/62* (2013.01); *C08L 83/16* (2013.01)

(58) Field of Classification Search
CPC ........ C08G 77/62; C08L 83/16; C09D 183/16
See application file for complete search history.

(56) References Cited

U.S. PATENT DOCUMENTS

2014/0293156 A1* 10/2014 Kim ...................... G06F 3/0412
349/12
2015/0004421 A1* 1/2015 Fujiwara ............... C23C 18/122
428/447

FOREIGN PATENT DOCUMENTS

JP          H06-299118 A      10/1994
JP          2000-186132    *   7/2000
WO       WO 2013/118642 A1    8/2013

* cited by examiner

*Primary Examiner* — Margaret G Moore
(74) *Attorney, Agent, or Firm* — Knobbe, Martens, Olson & Bear LLP (57) ABSTRACT

A composition capable of stably providing a high-quality siliceous film even under relatively low-temperature heating conditions, and a method of using the composition for forming a siliceous film. The composition includes a polysilazane and an imidazole group-containing compound represented by Formula (B).

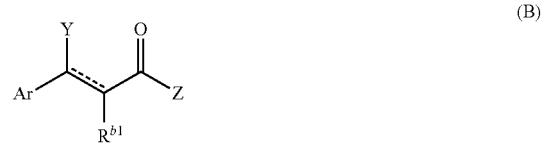

(B)

7 Claims, 3 Drawing Sheets

COMPOSITION AND METHOD OF PRODUCING SILICEOUS FILM

RELATED APPLICATION

This application claims priority to Japanese Patent Application No. 2017-004430, filed Jan. 13, 2017, the entire content of which is incorporated herein by reference.

BACKGROUND OF THE INVENTION

Field of the Invention

The present invention relates to a composition and a method of producing a siliceous film.

Related Art

Conventionally, polysilazanes have been used as materials forming a film, for example, an insulating film, such as an interlayer insulating film; a passivation film; a protective film; and a planarizing film in an electronic device, such as a semiconductor device. Specifically, a technique for transforming a polysilazane into a siliceous film by coating a solution containing the polysilazane onto a substrate and heating it in the presence of water molecules is known. For example, Patent Document 1 shows a polysilazane (inorganic polysilazane resin) suitable for such a use, more specifically, shows that the degree of shrinkage in the conversion from a polysilazane (inorganic polysilazane resin) into silica can be reduced by controlling the ratio between silicon atoms and nitrogen atoms included in the polysilazane (inorganic polysilazane resin) to a specific value or more and that occurrence of the residual stress in the resulting siliceous film can be suppressed.

Thus, in conversion from a polysilazane into silica, a technique of combining a polysilazane and a catalyst has been also conventionally developed from the viewpoint of accelerating the conversion reaction. For example, Patent Document 2 discloses a coating composition including a polysilazane and a specific metal carboxylate. This document shows that a combination of these components gives a dense coating film having excellent heat resistance, abrasion resistance, and corrosion resistance and being free from cracking by low-temperature heating or without heating. Furthermore, as shown in the paragraphs [0056] to [0064] of Patent Document 1, a technique of adding an N-heterocyclic compound or an amine compound to a composition including a polysilazane is also known.

Patent Document 1: PCT International Publication No. WO2013/118642

Patent Document 2: Japanese Unexamined Patent Application, Publication No. H06-299118

SUMMARY OF THE INVENTION

However, the catalysts described in Patent Documents 1 and 2 do not always show good compatibility to a polysilazane. Accordingly, even if the composition disclosed or suggested in Patent Document 1 or 2 is used, an uneven reaction is caused by heating, and as a result, a uniform siliceous film is not formed in some cases. Consequently, a composition capable of forming a uniform and high-quality siliceous film is demanded. In addition, there is a technical demand for reduction in the temperature for heating a polysilazane from the viewpoint of improving the process efficiency in formation of a siliceous film. Any of conventional compositions including polysilazanes does not sufficiently satisfy these requirements.

The present invention has been made in light of the circumference described above, and an object thereof is to provide a composition capable of stably giving a high-quality siliceous film even under relatively low-temperature heating conditions and a method of producing a siliceous film using the composition.

The present inventors have found that the problems mentioned above can be solved by combining a polysilazane (A) and a specific compound having an imidazole skeleton (imidazole group) to prepare a composition, and the present invention has been accomplished.

A first aspect of the present invention is a composition including a polysilazane (A); and an imidazole ring-containing compound (B) represented by Formula (B):

(in Formula (B), Ar is an optionally substituted aromatic group; $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; Y is an imidazole ring represented by Formula (B-y) or a hydrogen atom; Z is an imidazole ring represented by Formula (B-y) or a group represented by $-OR^{b3}$; Y or Z is the imidazole ring; and ━━━ is a single bond when Y is the imidazole ring and is a carbon-carbon double bond when Z is the imidazole ring, and $R^{b3}$ is a hydrogen atom or an organic group), (in Formula (B-y), the symbol * represents a bond that binds to a carbon atom adjacent to Y or Z in Formula (B); $R^{b2}$s are each independently a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group).

A second aspect of the present invention is a method of producing a siliceous film, the method including:

a step of preparing a substrate and the above-described composition;

a step of applying the composition onto the substrate; and a step of heating the substrate applied with the composition.

According to the present invention, it is possible to provide a composition capable of stably giving a high-quality siliceous film even under relatively low-temperature heating conditions and a method of producing a siliceous film using the composition.

DETAILED DESCRIPTION OF THE INVENTION

The present invention will now be described by way of embodiments. In the specification, a numerical range defined with "to" is meant to include the numbers preceeding and following the "to", unless otherwise specified.

<Composition>

The composition according to the embodiment at least includes the following components:

a polysilazane (A); and an imidazole group-containing compound (B) represented by Formula (B). Each component included in the composition according to the embodiment will now be described.

(Polysilazane (A))

The composition according to the embodiment includes a polysilazane (A). The polysilazane (A) that can be included in the composition of the embodiment is appropriately selected from known materials and is typically, for example, a compound having a Si—N bond in the compound structure (chemical structure).

Among known polysilazane materials, from the viewpoint of, for example, easiness in handling and easiness in acquisition, a preferably used in the embodiment is a polymer (polysilazane) including a structural unit represented by Formula (A0):

(A0).

In Formula (A0), $R^{a1}$, $R^{a2}$, and $R^{a3}$ may be the same or different and are a hydrogen atom, an alkyl group, a cycloalkyl group, or an aryl group. Herein, the alkyl group can be, for example, an alkyl group having 1 to 12 carbon atoms and may be a straight chain or a branched chain and more specifically can be, for example, a methyl group, an ethyl group, a propyl group, a butyl group, a pentyl group, a hexyl group, an octyl group, or a decyl group. The cycloalkyl group can be a cycloalkyl group having 3 to 12 carbon atoms and more specifically can be, for example, a cyclopropyl group, a cyclobutyl group, a cyclopentyl group, or a cyclohexyl group. The aryl group can be, for example, an aryl group having 6 to 12 carbon atoms and more specifically can be, for example, a phenyl group, a tolyl group (methylphenyl group), a xylyl group (dimethylphenyl group), or a naphthyl group. The number of the structural units represented by Formula (A0) included in the polysilazane (A) is usually an integer of two or more, and the upper limit of the number can be appropriately set to, for example, 3000 or less. In addition, the polysilazane (A) of the embodiment may include an N—Li bond, an N—K bond, or an N—Na bond in a part of the compound structure (chemical structure).

The polysilazane (A) in the embodiment preferably includes a structural unit represented by Formula (A0) in which $R^{a1}$, $R^{a2}$, are $R^{a3}$ are all hydrogen, i.e., a structural unit represented by Formula (A1), from the viewpoint of allowing smooth progress of the transformation into silica. The structural unit represented by Formula (A1) can be easily converted into silica ($SiO_2$) by being heated or sintered (usually, the conversion reaction herein is accompanied by occurrence of ammonia and hydrogen). In addition, a polysilazane including a structural unit represented by Formula (A0) in which at least one of $R^{a1}$, $R^{a2}$, and $R^{a3}$ is a carbon-containing functional group (an alkyl group, a cycloalkyl group, or an aryl group) in addition to the structural unit represented by Formula (A1) can also be preferably used as the polysilazane (A) in the composition in the embodiment.

Furthermore, the polysilazane (A) of the embodiment may include, for example, a structural unit having a branch structure as represented by Formula (A2) or (A3), considering the physical properties of the resulting coating film or heated siliceous film. $R^{a1}$ and $R^{a3}$ in Formulae (A2) and (A3) are synonymous with $R^{a1}$ and $R^{a3}$ in Formula (A0), respectively.

Such a polysilazane (A) can be synthesized by a known procedure, or a commercially available polysilazane material can be purchased. When the polysilazane (A) is synthesized, for example, a procedure of mixing and heating a compound, represented by ammonia, including a —NH group in the molecule and a compound including a Si—Cl group in the molecule and condensing (polymerizing) these compounds can be employed. The heating conditions herein may be appropriately set in light of the structure and molecular weight of the polysilazane to be obtained.

The polysilazane (A) in the embodiment may have any weight-average molecular weight, and the weight-average molecular weight is preferably 100 or more and 10000 or less, more preferably 500 or more and 8000 or less, and further preferably 800 or more and 5000 or less.

The content of the polysilazane (A) in the total solid in the composition of the embodiment may have any lower limit, and the lower limit is, for example, 10 mass % or more, preferably 20 mass % or more, and more preferably 40 mass % or more. Similarly, the upper limit of the polysilazane (A) content in the total solid in the composition of the embodiment is not particularly limited and is, for example, 99 mass % or less, preferably 98 mass % or less, and more preferably 95 mass % or less.

(Imidazole Group-Containing Compound (B) Represented by Formula (B))

The composition of the embodiment includes an imidazole group-containing compound (B) represented by Formula (B) (hereinafter, also simply referred to as "imidazole group-containing compound (B)"). The imidazole group-containing compound (B) is, as shown in Formula (B), a compound including an imidazole group (imidazole ring) in the molecule. By thus adding an imidazole group-containing compound having a specific structure to a composition including a polysilazane, the polysilazane can be transformed into a high-quality siliceous film during heating. The reasons for this are unclear, but it is considered that the above-described imidazole group-containing compound (B) has an appropriate polarity and releases imidazole at an appropriate rate when heated and as a result, can smoothly transform a polysilazane into silica. Hereinafter, the descriptions of the imidazole group-containing compound (B) that can be included in the composition of the embodiment will be continued.

The imidazole group-containing compound (B) that can be included in the composition of the embodiment is represented by Formula (B):

(B)

(in Formula (B), Ar is an optionally substituted aromatic group; $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; Y is an imidazole ring represented by Formula (B-y) or a hydrogen atom; Z is an imidazole ring represented by Formula (B-y) or a group represented by —$OR^{b3}$; and Y or Z is the imidazole ring; and ╌╌╌╌ is a single bond when Y is the imidazole ring and is a carbon-carbon double bond when Z is the imidazole ring, and $R^{b3}$ is a hydrogen atom or an organic group), (B-y)

(in Formula (B-y), the symbol * represents a bond that binds to a carbon atom adjacent to Y or Z in Formula (B); $R^{b2}$s are each independently a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group).

In Formula (B), Ar is an optionally substituted aromatic group. Ar may be an unsubstituted aromatic group. The optionally substituted aromatic group may be an optionally substituted aromatic hydrocarbon group or an optionally substituted aromatic heterocyclic group.

The aromatic hydrocarbon group constituting Ar may be any type within a range that does not disturb the purpose of the present invention. The aromatic hydrocarbon group may be a monocyclic aromatic group, may be formed by condensation of two or more aromatic hydrocarbon groups, or may be formed by binding two or more aromatic hydrocarbon groups with a single bond. The aromatic hydrocarbon group is preferably a phenyl group, a naphthyl group, a biphenylyl group, an anthryl group, or a phenanthrenyl group.

The aromatic heterocyclic group constituting Ar may be any type within a range that does not disturb the purpose of the present invention. The aromatic heterocyclic group may be a monocyclic group or may be a polycyclic group. The aromatic heterocyclic group is preferably a pyridyl group, a furyl group, a thienyl group, an imidazolyl group, a pyrazolyl group, an oxazolyl group, a thiazolyl group, an isooxazolyl group, an isothiazolyl group, a benzoxazolyl group, a benzothiazolyl group, or a benzoimidazolyl group.

Examples of the substituent of the aromatic hydrocarbon group or the aromatic heterocyclic group constituting Ar include a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, and an organic group. When the aromatic hydrocarbon group or the aromatic heterocyclic group includes a plurality of substituents, the substituents may be the same or different. When the aromatic hydrocarbon group or the aromatic heterocyclic group constituting Ar includes substituents, the number of the substituents is usually four or less, preferably three or less, may be two or less, or may be one.

When the substituent possessed by the aromatic hydrocarbon group or the aromatic heterocyclic group constituting Ar is a halogen atom, the halogen atom can be selected from a fluorine atom, a chlorine atom, a bromine atom, and an iodine atom.

When the substituent possessed by the aromatic hydrocarbon group or the aromatic heterocyclic group constituting Ar is an organic group, examples of the organic group include an alkyl group, an alkenyl group, a cycloalkyl group, a cycloalkenyl group, an aryl group, and an aralkyl group. The organic group may include a bond or a substituent other than hydrocarbon groups, such as a heteroatom, in the organic group. In addition, this organic group may be any of a straight chain, a branched chain, or a ring. The organic group is usually monovalent, but can be di- or more valent organic group, for example, when a ring structure is formed.

When a substituent is present on a carbon atom adjacent to the aromatic group constituting Ar, two substituents bonded to the adjacent carbon atom may be bonded to each other to form a ring structure. Examples of the ring structure include an aliphatic hydrocarbon ring and an aliphatic ring including a heteroatom.

When the substituent possessed by the aromatic hydrocarbon group or the aromatic heterocyclic group constituting Ar is an organic group, the organic group may include any bond that does not impair the effects of the present invention and may include a bond including a heteroatom, such as an oxygen atom, a nitrogen atom, a sulfur atom, and a silicon atom. From the viewpoint of heat resistance of the compound represented by Formula (B), examples of the bond including a heteroatom include an ether bond, a thioether bond, a carbonyl bond, a thiocarbonyl bond, an ester bond, an amide bond, an amino bond (—NR—: R represents a hydrogen atom or a monovalent organic group), an urethane bond, an imino bond (—N═C(—R)—, —C(═NR)—: R represents a hydrogen atom or an organic group), a carbonate bond, a sulfonyl bond, a sulfinyl bond, and an azo bond.

When the substituent possessed by Ar is a substituent other than a hydrocarbon group, the substituent other than a hydrocarbon group may be any type within a range that does not disturb the purpose of the present invention. Examples of the substituent other than a hydrocarbon group include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, an amino group, a monoalkylamino group, a dialkylaluminum group, a monoarylamino group, a diarylamino group, a carbamoyl group, a thiocarbamoyl group, a nitro group, a nitroso group, a carboxylate group, an acyl group, an acyloxy group, a sulfino group, a sulfonate group, a phosphino group, a phosphinyl group, a phosphonate group, an alkyl ether group, an alkenyl ether group, an alkyl thioether group, an alkenyl thioether group, an aryl ether group, and an aryl thioether group. The hydrogen atom included in the substituent may be substituted by a hydrocarbon group. The hydrocarbon group included in the substituent may be any of a straight chain, a branched chain, or a ring.

The substituent possessed by the aromatic hydrocarbon group or the aromatic heterocyclic group constituting Ar is preferably an alkyl group having 1 to 12 carbon atoms, an aryl group having 1 to 12 carbon atoms, an alkoxy group having 1 to 12 carbon atoms, an aryloxy group having 1 to 12 carbon atoms, an arylamino group having 1 to 12 carbon atoms, and a halogen atom.

Ar is preferably an optionally substituted phenyl group, furyl group, or thienyl group, which allows the compound represented by Formula (B) to be inexpensively and easily synthesized and has high solubility in an organic solvent.

In Formula (B), $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group.

When $R^{b1}$ is a halogen atom, the halogen atom can be selected from a fluorine atom, a chlorine atom, a bromine atom, and an iodine atom.

When $R^{b1}$ is an organic group, the organic group is preferably an alkyl group, an aromatic hydrocarbon group, or an aromatic heterocyclic group. The alkyl group is preferably a linear or branched alkyl group having 1 to 8 carbon atoms and more preferably a methyl group, an ethyl group, an n-propyl group, or an isopropyl group. The aromatic hydrocarbon group is preferably a phenyl group, a naphthyl group, a biphenylyl group, an anthryl group, or a phenanthrenyl group, more preferably a phenyl group or a naphthyl group, and particularly preferably a phenyl group. The aromatic heterocyclic group is preferably a pyridyl group, a furyl group, a thienyl group, an imidazolyl group, a pyrazolyl group, an oxazolyl group, a thiazolyl group, an isooxazolyl group, an isothiazolyl group, a benzoxazolyl group, a benzothiazolyl group, or a benzoimidazolyl group and more preferably a furyl group or a thienyl group.

In Formula (B), Y is an imidazole ring represented by Formula (B-y) or a hydrogen atom. Formula (B-y) will be described later.

In Formula (B), Z is an imidazole ring represented by Formula (B-y) or a group represented by —$OR^{b3}$. This $R^{b3}$ is a hydrogen atom or an organic group. When $R^{b3}$ is an organic group, the organic group is preferably an alkyl group. The alkyl group may be a linear alkyl group or may be a branched alkyl group. The number of carbon atoms of the alkyl group is not particularly limited and is preferably 1 to 20, preferably 1 to 10, and more preferably 1 to 5.

Preferred examples of the alkyl group as $R^{b3}$ include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, a 2-ethyl-n-hexyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group.

In Formula (B), Y or Z is an imidazole ring represented by Formula (B-y). The imidazole group-containing compound (B) is typically a compound represented by Formula (B2) described later when Y is the imidazole ring and is typically a compound represented by Formula (B1) described later when Z is the imidazole ring.

In Formula (B), ---------
is a single bond when Y is an imidazole ring represented by Formula (B-y) and is a carbon-carbon double bond when Z is the imidazole ring.

In Formula (B-y), the symbol * represents a bond that binds to a carbon atom adjacent to Y or Z in Formula (B).

In Formula (B-y), $R^{b2}$ is a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group; and any of these atoms and groups binds to the imidazole ring.

When $R^{b2}$ is a halogen atom, the halogen atom can be selected from a fluorine atom, a chlorine atom, a bromine atom, and an iodine atom.

When $R^{b2}$ is an organic group, examples of the organic group include an alkyl group, an alkenyl group, a cycloalkyl group, a cycloalkenyl group, an aromatic hydrocarbon group, an aromatic heterocyclic group, and aralkyl group. The organic group may include a bond or a substituent, such as a heteroatom, other than a hydrocarbon group. The organic group may be any of a straight chain, a branched chain, or a ring. The organic group is usually monovalent, but can be di- or more valent organic group, for example, when a ring structure to be condensed with an imidazole ring is formed. In the specification, the term "heteroatom" refers to an oxygen atom, a nitrogen atom, and a sulfur atom, unless otherwise specified.

When $R^{b2}$ is an organic group, the organic group is preferably an alkyl group, an aromatic hydrocarbon group, or an aromatic heterocyclic group. The alkyl group is preferably a linear or branched alkyl group having 1 to 8 carbon atoms and more preferably a methyl group, an ethyl group, an n-propyl group, or an isopropyl group. The aromatic hydrocarbon group is preferably a phenyl group, a naphthyl group, a biphenylyl group, an anthryl group, or a phenanthrenyl group, more preferably a phenyl group or a naphthyl group, and particularly preferably a phenyl group. The aromatic heterocyclic group is preferably a pyridyl group, a furyl group, a thienyl group, an imidazolyl group, a pyrazolyl group, an oxazolyl group, a thiazolyl group, an isooxazolyl group, an isothiazolyl group, a benzoxazolyl group, a benzothiazolyl group, or a benzoimidazolyl group, and more preferably a furyl group or a thienyl group.

When $R^{b2}$ is an organic group, the 2-position, the 4-position, and the 5-position are all preferable as the binding site of the organic group on the imidazole ring, and the 2-position is more preferred.

Examples of the imidazole group-containing compound (B) that is preferably used include imidazole group-containing compounds represented by Formula (B1) or (B2).

(Imidazole Group-Containing Compound Represented by Formula (B1))

The imidazole group-containing compound (B) that can be included in the composition of the embodiment is, as one aspect, represented by Formula (B1):

(in Formula (B1), $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; $R^{b2}$s are each independently a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group; and Ar is an optionally substituted aromatic group).

In Formula (B1), $R^{b1}$, $R^{b2}$, and Ar are respectively the same as those in Formula (B). Accordingly, the descriptions thereof are omitted herein.

Among the imidazole group-containing compounds represented by Formula (B1) that can be included in the composition, from the viewpoint of the solubility in the organic solvent (S) and the compatibility to the polysilazane (A), a compound preferred in the embodiment is represented by Formula (B1-1):

(in Formula (B1-1), $R^{b1}$ and $R^{b2}$ are synonymous with those in Formula (B1); $R^{b4}$ to $R^{b7}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and $R^{b8}$ is a hydrogen atom or an organic group).

In Formula (B1-1), $R^{b1}$ and $R^{b2}$ are synonymous with those in Formula (B1) and are therefore synonymous with those in Formula (B).

In Formula (B1-1), $R^{b4}$ to $R^{b7}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group. When $R^{b4}$ to $R^{b7}$ are halogen atoms, the halogen atoms that can be employed are the same as those that may substitute Ar in Formula (B). When $R^{b4}$ to $R^{b7}$ are organic groups, the organic groups that can be employed are the same as those that may substitute Ar in Formula (B).

In Formula (B1-1), $R^{b8}$ is a hydrogen atom or an organic group. In particular, $R^{b8}$ is preferably an organic group, which can further enhance the compatibility to the polysilazane (A) and solubility in the organic solvent (S). Examples of the organic group constituting $R^{b8}$ include an alkyl group, an alkenyl group, a cycloalkyl group, a cycloalkenyl group, an aryl group, and an aralkyl group. Among these organic groups, preferred is an alkyl group. The alkyl group may be a linear alkyl group or may a branched alkyl group. The number of carbon atoms of the alkyl group is not particularly limited and is preferably 1 to 20, preferably 1 to 10, and more preferably 2 to 5.

In Formula (B1-1), preferred examples of the alkyl group as $R^{b8}$ include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, a 2-ethyl-n-hexyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. Among these alkyl groups, preferred are a methyl group, an ethyl group, an n-propyl group, an isopropyl group, an n-butyl group, an isobutyl group, a sec-butyl group, a tert-butyl group, an n-pentyl group, an isopentyl group, and a tert-pentyl group, and from the viewpoint of further improving the compatibility to the polysilazane (A) and the solubility in the organic solvent (S), particularly preferred are branched chain-containing isopropyl group, isobutyl group, sec-butyl group, tert-butyl group, isopentyl group, and tert-pentyl group.

Preferred examples of the compound represented by Formula (B1) include the followings.

(Imidazole Group-Containing Compound Represented by Formula (B2))

The imidazole group-containing compound (B) that can be included in the composition of the embodiment is, as one aspect, represented by Formula (B2). This imidazole group-containing compound (B) represented by Formula (B2) corresponds to a compound prepared by applying a compound represented by Formula (B1) to a heating condition and relocating the imidazole group to the β-position of the α,β-unsaturated carbonyl site. Accordingly, a process of the method of producing a siliceous film described later can provide the same effect as that on the compound represented by Formula (B1).

(In Formula (B2), $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; $R^{b2}$s are each independently a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group; $R^{b3}$ is a hydrogen atom or an organic group; and Ar is an optionally substituted aromatic group.)

In Formula (B2), $R^{b1}$, $R^{b2}$, $R^{b3}$, and Ar are respectively the same as those in Formula (B), and the descriptions thereof are omitted herein.

Among the imidazole group-containing compounds represented by Formula (B2) that can be included in the composition of the embodiment, from the viewpoint of the solubility in the organic solvent (S) and the compatibility to the polysilazane (A), preferred are compounds represented by (in Formula (B2-1), $R^{b1}$, $R^{b2}$, and $R^{b3}$ are synonymous with those in Formula (B2); $R^{b4}$ to $R^{b7}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and $R^{b8}$ is a hydrogen atom or an organic group).

In Formula (B2-1), $R^{b1}$, $R^{b2}$, and $R^{b3}$ are synonymous with those in Formula (B2) and are therefore synonymous with those in Formula (B).

In Formula (B2-1), $R^{b4}$ to $R^{b8}$ can be the same as those in Formula (B1-1).

In Formula (B2-1), $R^{b8}$ is a hydrogen atom or an organic group. In particular, $R^{b8}$ is preferably an organic group, which can further enhance the compatibility to the polysilazane (A) and solubility in the organic solvent (S). Examples of the organic group constituting $R^{b8}$ include an alkyl group, an alkenyl group, a cycloalkyl group, a cycloalkenyl group, an aryl group, and an aralkyl group.

Among these organic groups, preferred is an alkyl group. The alkyl group may be a linear alkyl group or may a branched alkyl group. The number of carbon atoms of the alkyl group is not particularly limited and is preferably 1 to 20, preferably 1 to 10, and more preferably 2 to 5.

Preferred examples of the alkyl group as $R^{68}$ include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, a 2-ethyl-n-hexyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. Among these alkyl groups, preferred are a methyl group, an ethyl group, an n-propyl group, an isopropyl group, an n-butyl group, an isobutyl group, a sec-butyl group, a tert-butyl group, an n-pentyl group, an isopentyl group, and a tert-pentyl group, and from the viewpoint of further improving the compatibility to the polysilazane (A) and the solubility in the organic solvent (S), particularly preferred are branched chain-containing isopropyl group, isobutyl group, sec-butyl group, tert-butyl group, isopentyl group, and tert-pentyl group.

Preferred examples of the compound represented by Formula (B2) include the followings.

The lower limit of the content of the imidazole group-containing compound (B) in the composition of the embodiment is not particularly limited and is, for example, 1 mass % or more, preferably 2 mass % or more, more preferably 3 mass % or more, and may be 5 mass % or more, based on 100 parts by mass of the polysilazane (A). Similarly, the upper limit of the content of the imidazole group-containing compound (B) in the composition of the embodiment is not particularly limited and is, for example, 25 mass % or less, preferably 20 mass % or less, more preferably 15 mass % or more, and further preferably 10 mass % or less, based on 100 parts by mass of the polysilazane (A).

(Organic Phosphorus Compound (C))

The composition of the embodiment may include an organic phosphorus compound (C) for smoothly converting the polysilazane (A) into a siliceous film. In the specification, the term "organic phosphorus compound (C)" is used as a concept encompassing not only a single compound including a phosphorus atom in the structure but also a composite of a molecule including a phosphorus atom in the structure and another molecule. Examples of the organic phosphorus compound (C) include phosphine compounds, such as tributylphosphine, triphenylphosphine, tris(p-tolyl)phosphine, tris(m-tolyl)phosphine, tris(o-tolyl)phosphine, diphenylcyclohexylphosphine, tricyclohexylphosphine, tris(dimethoxyphenyl)phosphine, and 1,4-bis(diphenylphosphino)butane; phosphonium salts, such as ethyltriphenylphosphonium bromide and benzyltriphenylphosphonium chloride; composites of an organic phosphorus compound and a boron compound, such as triphenylphosphine triphenylborane, tetraphenylphosphonium tetra-p-tolylborate, and tetraphenylphosphonium tetraphenylborate; and composites of an organic phosphorus compound and a nitrogen compound, such as tetraphenylphosphonium thiocyanate, tetraphenylphosphonium dicyanamide, and n-butyltriphenylphosphonium dicyanamide.

When the composition of the embodiment includes an organic phosphorus compound (C), the lower limit of the content of the organic phosphorus compound (C) in the composition is, for example, 1 part by mass or more, preferably 2 parts by mass or more, more preferably 3 parts by mass or more, and may be 5 parts by mass or more, based on 100 parts by mass of the polysilazane (A), from the viewpoint of enhancing the transformation of the polysilazane into a siliceous film. Similarly, when the composition of the embodiment includes an organic phosphorus compound (C), the upper limit of the content of the organic phosphorus compound (C) in the composition is, for example, 30 parts by mass or less, preferably 25 parts by mass or less, more preferably 15 parts by mass or less, and may be 10 parts by mass or less, based on 100 parts by mass of the polysilazane (A), from the viewpoint of the storage stability of the composition.

(Other Components)

The composition of the embodiment can contain additive components as needed, in addition to the components (A), (B), and (C). Examples of the additive component include crosslinking promoters promoting crosslinking reaction of the polysilazane (A); imidazoles, such as 2-methylimidazole and 2-ethyl-4-methylimidazole; amine compounds and salts thereof, such as 2,4,6-tris(dimethylaminomethyl)phenol, benzylmethylamine, 1,8-diazabicyclo[5.4.0]-7-undecene (DBU), and 3-(3,4-dichlorophenyl)-1,1-dimethyl urea (DCMU); catalysts, such as metal carboxylates for the reaction of converting into a siliceous film of other than the organic phosphorus compound (C); viscosity modifiers for adjusting the viscosity of the composition; and leveling agents. The amounts of these components are appropriately set according to the purpose.

(Organic Solvent (S))

The composition of the embodiment preferably includes an organic solvent (S) for improving the coating properties and controlling the viscosity. Examples of the organic solvent (S) include (poly)alkylene glycol monoalkyl ethers, such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates, such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate (PGMEA), and propylene glycol monoethyl ether acetate; other ethers, such as diethylene glycol dimethyl ether, diethylene glycol methylethyl ether, diethylene glycol diethyl ether, diethyl ether, dipropyl ether, dibutyl ether (di-n-butyl ether and di-t-butyl ether), cyclopentyl methyl ether, and tetrahydrofuran; ketones, such as methyl ethyl ketone, cyclohexanone, 2-heptanone, and 3-heptanone; alkyl lactates, such as 2-hydroxypropionic acid methyl ester and 2-hydroxypropionic acid ethyl ester; other esters, such as 2-hydroxy-2-methylpropionic acid ethyl ester, 3-methoxypropionic acid methyl ester, 3-methoxypropionic acid ethyl ester, 3-ethoxypropionic acid methyl ester, 3-ethoxypropionic acid ethyl ester, ethoxyacetic acid ethyl ester, hydroxyacetic acid ethyl ester, 2-hydroxy-3-methylbutanoic acid methyl ester, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, benzyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and 2-oxobutanoic acid ethyl ester; aromatic hydrocarbons, such as toluene and xylene; and nitrogen-containing polar organic solvents, such as N-methyl-2-pyrrolidone, N,N-dimethylformamide, N,N-dimethylacetamide, N,N-dimethylisobutylamide, N,N-diethylacetamide, N,N-diethylformamide, N-methylcaprolactam, 1,3-dimethyl-2-imidazolidinone, pyridine, and N,N',N'-tetramethylurea.

Among these organic solvents, preferred are alkylene glycol monoalkyl ethers, alkylene glycol monoalkyl ether acetates, the above-mentioned other ethers, and nitrogen-containing polar organic solvents; and more preferred are the above-mentioned other ethers and nitrogen-containing polar organic solvents. In addition, for example, from the viewpoint of solubility of each component, the organic solvent (S) is particularly preferred to include a nitrogen-containing polar organic solvent. The nitrogen-containing polar organic solvent that can be used is, for example, N,N,N',N'-tetramethylurea. These organic solvents (S) can be used alone or in combination of two or more thereof.

The amount of the organic solvent (S) may be appropriately set in light of, for example, the coating properties of the composition. For example, the organic solvent (S) can be used such that the solid content concentration of the composition is 1 mass % or more, preferably 3 mass % or more, and more preferably 5 mass % or more. Similarly, the organic solvent (S) can be used such that the solid content concentration of the composition is 50 mass % or less and more preferably 40 mass % or less.

<Method of Preparing Composition>

The composition described above can be prepared by mixing the above-described components in predetermined amounts and then uniformly mixing them with a mixer. The mixture may be filtered through a filter so that the resulting mixture becomes more uniform.

<Method of Producing Siliceous Film>

The descriptions of the specific use of the composition according to the embodiment will now be continued. The composition according to the embodiment can be typically used in production of a siliceous film. Such a siliceous film can constitute, for example, an insulating film, a passivation film, a planarizing film, a hard mask in a semiconductor device. Accordingly, it can be said that the composition of the embodiment can be suitably used for forming such various films and a hard mask.

Specifically, the method of producing a siliceous film of the embodiment includes the following steps:

($\alpha$) a step of preparing a substrate and the above-described composition;

($\beta$) a step of applying the composition onto the substrate; and ($\gamma$) a step of heating the substrate applied with the composition. Each step will now be described.

(Step ($\alpha$))

In the step ($\alpha$), a substrate and a composition are prepared. The composition may be prepared by the procedure shown in the paragraph <Method of preparing composition> described above. The substrate may be appropriately selected according to the use. For example, a semiconductor substrate, such as a silicon substrate; a glass substrate; a metal substrate, such as a copper substrate and an alumina substrate; or a resin substrate, such as a polyethylene phthalate (PET) substrate, can be used as the substrate in the method of producing a siliceous film of the embodiment. Additionally, a substrate laminated with a layer constituted of another component or a substrate provided with a circuit and so on can also be covered as the substrate of the embodiment including the laminated layer or the circuit. Among these substrates, in the method of producing a siliceous film of the embodiment, the semiconductor substrate can withstand the heating conditions in the step ($\gamma$) described later and therefore can be preferably used.

(Step ($\beta$))

In the step ($\beta$), the composition is applied onto the substrate. The application can be typically carried out by coating. The method of the coating can be appropriately selected considering, for example, the type of the substrate and the physical properties of the composition. More specifically, as the application or the coating method of the step ($\beta$), for example, a spin coating method, a dipping method, a spraying method, a roll coating method, a transferring method, or a slit coating method can be employed. Furthermore, from the viewpoint of efficiently achieving a desired film thickness, a combination of these coating methods may be carried out as the step ($\beta$). Among these coating methods, from the viewpoint of stabilizing the coating film thickness and improving the process efficiency, the spin coating method is preferably employed.

The method of producing a siliceous film of the embodiment can include a pre-baking step after the step ($\beta$) and before the subsequent step ($\gamma$). When the composition includes an organic solvent (S), the pre-baking step allows the organic solvent (S) in the coating film to be effectively removed and contributes to improvement in the process efficiency. Furthermore, this pre-baking step may be purposed for precuring for the subsequent step ($\gamma$). The temperature conditions and the time conditions of the pre-baking step can be appropriately set depending on the content of the composition. For example, the temperature conditions that can be employed are 50° C. to 300° C. and preferably 75° C. to 250° C. The time conditions that can be employed are, for example, conditions of 20 to 900 seconds and preferably 60 to 300 seconds. Regarding the temperature conditions, the pre-baking step may be carried out at a constant temperature or may be carried out while stepwise changing the temperature. The apparatus for carrying out the pre-baking step can be appropriately selected. As an example, a hot plate can be used.

The thickness of the coating film obtained after the step (β) (or after the pre-baking step) can be appropriately set according to the use of the finally obtained siliceous film, and is, for example, 10 nm or more, preferably 30 nm or more, and more preferably 50 nm or more. At the same time, the thickness of the coating film obtained in this step is, for example, 2500 nm or less, preferably 2000 nm or less, and more preferably 1500 nm or less. The thickness of the coating film after the step (β) (or after the pre-baking step) can be defined as the dry film thickness or can be defined as the average thickness of the coating film.

(Step (γ))

In the step (γ), the substrate coated with the composition is heated. The heating conditions herein can be appropriately set according to the composition to be used and the type of the substrate. The temperature conditions that can be employed are, for example, 100° C. or more, preferably 125° C. or more, and more preferably 150° C. or more. At the same time, the temperature conditions that can be employed are, for example, 700° C. or less, preferably 600° C. or less, and more preferably 500° C. or less. A polysilazane can be stably transformed into a siliceous film with high process efficiency by employing such temperature conditions.

The time conditions that can be employed in the heating are, from the viewpoint of stably transforming a polysilazane into a siliceous film, for example, 10 minutes or more, preferably 15 minutes or more, and more preferably 20 minutes or more. At the same time, the time conditions that can be employed in the heating are, from the viewpoint of process efficiency, for example, 180 minutes or less, preferably 150 minutes or less, and more preferably 120 minutes or less.

The step (γ) is typically carried out in the presence of water molecules for stably transforming a polysilazane (A) into a siliceous film. The water molecules may be the water included in the composition. A polysilazane may be transferred into a siliceous film by performing the heating in the presence of moisture (water vapor). Specifically, the heating can be performed under an air atmosphere containing moisture, or the heating may be performed in an atmosphere initiatively containing water vapor. Furthermore, from the viewpoint of further enhancing this transformation into a siliceous film, the atmosphere for the heating can be an acid atmosphere or a basic atmosphere. In addition, from the viewpoint of further enhancing the transformation into a siliceous film, the oxygen concentration in the atmosphere also can be controlled, or the atmosphere can contain hydrogen peroxide vapor.

The apparatus for heating in the step (γ) can be appropriately set as far as the desired heating temperature can be achieved. Specifically, as the apparatus for heating, a curing oven (muffle furnace) or a hot plate can be used.

After the step (γ), an annealing step may be further combined. The combination with the annealing step allows to expect the effects of, for example, further easily smoothening the surface of the resulting siliceous film and suppressing variation in the composition of the siliceous film. The annealing step can be carried out in a similar atmosphere to that for the heating step and carried out, for example, by changing the temperature and other conditions of the curing oven. The temperature for the annealing step is, for example, 300° C. or more, preferably 400° C. or more, and more preferably 500° C. or more. At the same time, the temperature for the annealing step is, for example, 1300° C. or less, preferably 1200° C. or less, and more preferably 1000° C. or less. The treatment time (annealing treatment time) in the annealing step is, for example, 5 minutes or more, preferably 10 minutes or more, and more preferably 15 minutes or more. At the same time, the treatment time (annealing treatment time) in the annealing step is, for example, 5 hours or less, preferably 4 hours or less, and more preferably 3 hours or less.

The present invention has been described based on the embodiments described above, but is not limited to the above-described embodiments, and the configuration can be modified within a range not departing from the gist of the present invention.

EXAMPLES

The present invention will now be described in more detail by examples, but is not limited to the following examples.

Examples 1 to 4, Comparative Example 1

Components used in each of Examples and Comparative Example are shown below.

Polysilazane (A)

A1: perhydropolysilazane (weight-average molecular weight: about 1500) having a structural unit represented by Formula (A1):

Imidazole Group-Containing Compound (B)

B1: compound represented by Formula (1):

Organic Phosphorus Compound (C)

C1: triphenylphosphine triphenylborane

Organic Solvent (S)

S1: di-n-butyl ether

S2: N,N,N',N'-tetramethylurea

In each of Examples and Comparative Example, the components were mixed in the proportions shown in Table 1 to prepare each composition. Besides, the C1 component is treated as an N,N,N',N'-tetramethylurea solution having a solid content concentration of 3%, and in Table 1, the amount of the C1 component is shown as the solid content amount, and the amount of the S2 component is shown as the calculated value of the solvent amount. Regarding the A1 and B1 components, the solid content amounts thereof are shown in Table 1.

The thus-prepared each composition was evaluated according to the following items <Evaluation of film properties by FT-IR> and <Evaluation of etching rate>.

<Evaluation of Film Properties by FT-IR (Evaluation 1)>

The compositions of Examples and Comparative Example were coated onto 6-inch silicon substrates by spin coating to give a dry film thickness of 500 nm. Each of the resulting coating films was pre-baked on a hot plate at 150° C. for 3 minutes and was then heated in a vertical baking furnace (TS8000 MB, manufactured by Tokyo Ohka Kogyo Co., Ltd.) under air conditions at 400° C. for 30 minutes to obtain a siliceous film. The resulting siliceous films were analyzed with an FT-IR (Fourier transform infrared spectrophotometer: FT/IR-615, manufactured by JASCO Corporation) to validate the film properties. The results in Examples and Comparative Example are shown in FIGS. 1 to 5.

<Evaluation of Etching Rate (Evaluation 2)>

Siliceous films were prepared by the same procedure as that in <Evaluation of film properties by FT-IR>, and were then immersed in a 0.5% hydrofluoric acid aqueous solution for 4 minutes under room temperature conditions. Etching rate [angstrom/min] was calculated from the film thicknesses before and after the immersion in the hydrofluoric acid aqueous solution. The results are shown in Table 1.

TABLE 1

Figure 1:
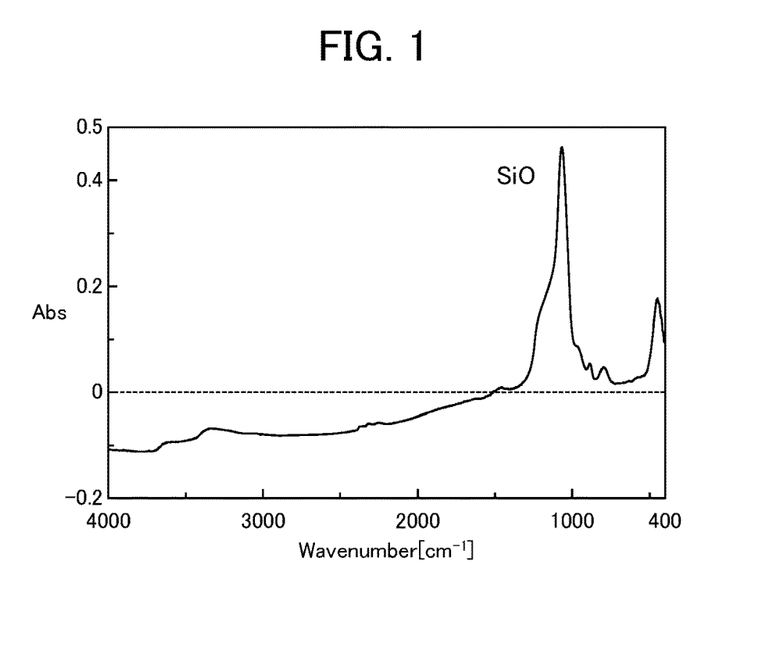
FIG. 1 is a graph showing the results of analysis by FT-IR in Example 1.
Figure 2:
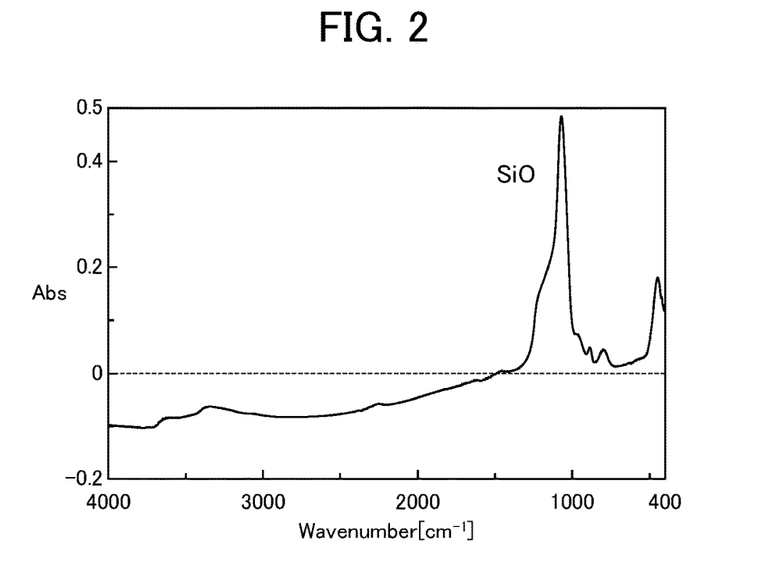
FIG. 2 is a graph showing the results of analysis by FT-IR in Example 2.
Figure 3:
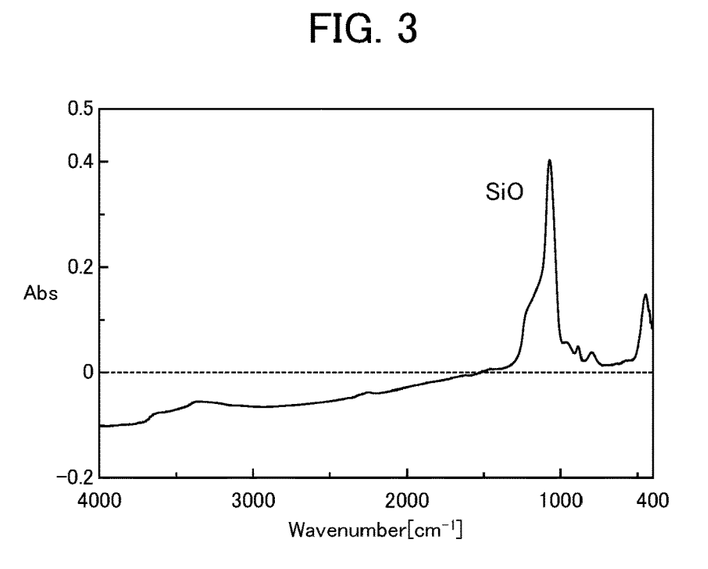
FIG. 3 is a graph showing the results of analysis by FT-IR in Example 3.
Figure 4:
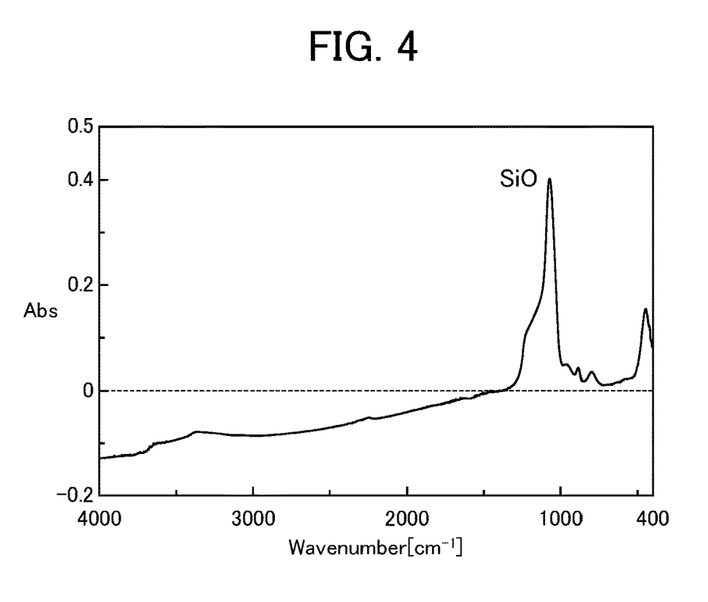
FIG. 4 is a graph showing the results of analysis by FT-IR in Example 4.
Figure 5:
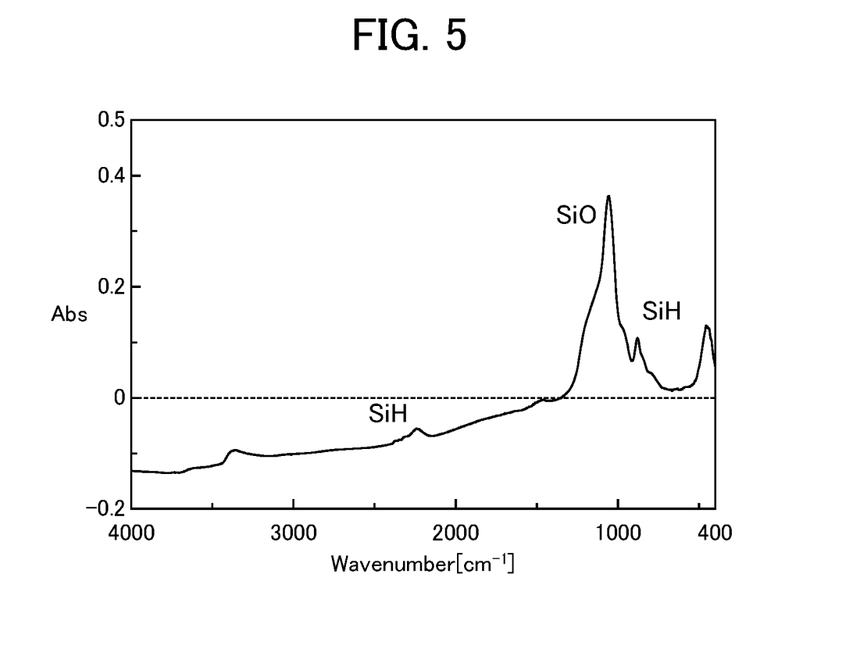
FIG. 5 is a graph showing the results of analysis by FT-IR in Comparative Example 1.

|  |  | Example 1 | Example 2 | Example 3 | Example 4 | Comparative Example 1 |
|---|---|---|---|---|---|---|
| Composition (parts by mass) | A1 | 100 | 100 | 100 | 100 | 100 |
|  | B1 | 5 | 10 | 5 | 10 | — |
|  | C1 | 5 | 5 | 10 | 10 | — |
|  | S1 | 400 | 400 | 400 | 400 | 400 |
|  | S2 | 165 | 165 | 330 | 330 | — |
| Evaluation | Evaluation 1 | see FIG. 1 | see FIG. 2 | see FIG. 3 | see FIG. 4 | see FIG. 5 |
|  | Evaluation 2 [angstrom/min] | 255 | 240 | 205 | 180 | 315 |

As shown in FIGS. 1 to 5, in each of the siliceous films obtained in Examples, the signals (at near 2200 cm$^{-1}$ and near 850 cm$^{-1}$) derived from SiH are relatively weak, and the signal (at near 1100 cm$^{-1}$) relatively derived from SiO is strong, compared to those of the film obtained in Comparative Example. In addition, the etching rate of the film in each Example is lower than that of the film of Comparative Example 1. These results demonstrate that each Example gives better film properties of a siliceous film.

What is claimed is:

1. A composition comprising:
   a polysilazane (A); and
   an imidazole group-containing compound (B) represented by Formula (B):

(B)

wherein Ar is an optionally substituted aromatic group; $R^{b1}$ is a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, or an organic group; Y is an imidazole ring represented by Formula (B-y) or a hydrogen atom; Z is an imidazole ring represented by Formula (B-y) or a group represented by —OR$^{b3}$; Y or Z is the imidazole ring; and ╌╌╌╌
is a single bond when Y is the imidazole ring and is a carbon-carbon double bond when Z is the imidazole ring, and $R^{b3}$ is a hydrogen atom or an organic group, (B-y)

wherein the symbol * represents a bond that binds to a carbon atom adjacent to Y or Z in Formula (B); $R^{b2}$s are each independently a hydrogen atom, a halogen atom, a hydroxyl group, a mercapto group, a sulfide group, a silyl group, a silanol group, a nitro group, a nitroso group, a sulfonate group, a phosphino group, a phosphinyl group, a phosphonate group, or an organic group.

2. The composition according to claim 1, wherein the imidazole group-containing compound (B) is a compound represented by Formula (B1-1):

(B1-1)

wherein $R^{b1}$ and $R^{b2}$ are synonymous with those in Formula (B); $R^{b4}$ to $R^{b7}$ are each independently a hydrogen atom, a halogen atom, a hydroxyl group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, or an organic group; and $R^{b8}$ is a hydrogen atom or an organic group.

3. The composition according to claim 1, wherein the polysilazane (A) includes a structural unit represented by Formula (A1) in the structure (A1)

4. The composition according to claim 1, further comprising an organic phosphorus compound (C).

5. A method of producing a siliceous film, comprising:
preparing a substrate and a composition according to claim 1;
applying the composition onto the substrate; and
heating the substrate applied with the composition.

6. The method of producing a siliceous film according to claim 5, wherein the substrate is heated at 100° C. or more and 700° C. or less.

7. The method of producing a siliceous film according to claim 5, wherein the siliceous film comprises an insulating film, a passivation film, a planarizing film, or a hard mask.

* * * * *